US012218207B2

(12) United States Patent
Zhao et al.

(10) Patent No.: US 12,218,207 B2
(45) Date of Patent: *Feb. 4, 2025

(54) METHOD FOR MANUFACTURING SEMICONDUCTOR DEVICE

(71) Applicant: INNOSCIENCE (SUZHOU) TECHNOLOGY CO., LTD., Suzhou (CN)

(72) Inventors: Qiyue Zhao, Suzhou (CN); Wuhao Gao, Suzhou (CN); Fengming Lin, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,609

(22) Filed: Jan. 15, 2024

(65) Prior Publication Data

US 2024/0162306 A1 May 16, 2024

Related U.S. Application Data

(62) Division of application No. 17/275,680, filed as application No. PCT/CN2021/076958 on Feb. 19, 2021, now Pat. No. 11,929,406.

(51) Int. Cl.
*H01L 21/56* (2006.01)
*H01L 23/31* (2006.01)
(Continued)

(52) U.S. Cl.
CPC ............ *H01L 29/404* (2013.01); *H01L 21/56* (2013.01); *H01L 23/3171* (2013.01);
(Continued)

(58) Field of Classification Search
CPC ............ H01L 23/3171; H01L 23/3178; H01L 23/3192; H01L 29/404
See application file for complete search history.

(56) References Cited

U.S. PATENT DOCUMENTS 7,388,236 B2    6/2008    Wu et al.
7,573,078 B2    8/2009    Wu et al.
(Continued)

FOREIGN PATENT DOCUMENTS

CN    1950945      4/2007
CN    101410985    4/2009
(Continued)

OTHER PUBLICATIONS

English translation of "International Search Report (Form PCT/ISA/210) of PCT/CN2021/076958", mailed on Nov. 18, 2021, pp. 1-3.
(Continued)

Primary Examiner — Daniel P Shook
(74) Attorney, Agent, or Firm — JCIPRNET

(57) ABSTRACT

A method for manufacturing a semiconductor device including steps as follows is provided. A first nitride-based semiconductor layer is formed over a substrate. A second nitride-based semiconductor layer is formed on the first nitride-based semiconductor layer. A gate electrode is formed over the second nitride-based semiconductor layer. A first passivation layer is formed on the second nitride-based semiconductor layer to cover the gate electrode. A first blanket field plate is formed on the first passivation layer. The first blanket field plate is patterned to form a first field plate above the gate electrode using a wet etching process. A second passivation layer is formed on the first passivation layer to cover the first field plate. A second blanket field plate is formed on the second passivation layer. The second blanket field plate
(Continued)

is patterned to form a second field plate above the first field plate using a dry etching process.

5 Claims, 12 Drawing Sheets

(51) Int. Cl.
    *H01L 29/20*     (2006.01)
    *H01L 29/40*     (2006.01)
    *H01L 29/417*     (2006.01)
    *H01L 29/66*     (2006.01)
    *H01L 29/778*     (2006.01)

(52) U.S. Cl.
    CPC ...... *H01L 23/3192* (2013.01); *H01L 29/2003* (2013.01); *H01L 29/401* (2013.01); *H01L 29/41775* (2013.01); *H01L 29/66462* (2013.01); *H01L 29/7787* (2013.01)

(56) References Cited

U.S. PATENT DOCUMENTS

| | | | |
|---|---|---|---|
| 8,664,695 | B2 | 3/2014 | Wu et al. |
| 8,890,168 | B2 | 11/2014 | Lidow et al. |
| 10,998,433 | B2 | 5/2021 | Hung et al. |
| 11,929,406 | B2 * | 3/2024 | Zhao ............... H01L 29/41775 |
| 2005/0051796 | A1 | 3/2005 | Parikh et al. |
| 2005/0253168 | A1 | 11/2005 | Wu et al. |
| 2006/0226442 | A1 | 10/2006 | Zhang et al. |
| 2007/0235775 | A1 | 10/2007 | Wu et al. |
| 2007/0296085 | A1 | 12/2007 | Coolbaugh et al. |
| 2009/0267116 | A1 | 10/2009 | Wu et al. |
| 2014/0027782 | A1 | 1/2014 | Michael et al. |
| 2014/0061659 | A1 | 3/2014 | Teplik et al. |
| 2014/0264453 | A1 | 9/2014 | Moens et al. |
| 2015/0109553 | A1 | 4/2015 | Kubota |
| 2015/0115458 | A1 | 4/2015 | Palm |
| 2015/0357422 | A1 | 12/2015 | Liao |
| 2016/0141404 | A1 | 5/2016 | Tsai et al. |
| 2018/0331186 | A1 | 11/2018 | Srivastava et al. |
| 2020/0295171 | A1 | 9/2020 | Hung et al. |
| 2021/0184005 | A1 | 6/2021 | Liu |

FOREIGN PATENT DOCUMENTS

| | | |
|---|---|---|
| CN | 106684140 | 5/2017 |
| CN | 107068739 | 8/2017 |
| CN | 109659361 | 4/2019 |
| CN | 111261714 | 6/2020 |
| CN | 111509041 | 8/2020 |
| CN | 111613666 | 9/2020 |
| CN | 111682065 | 9/2020 |
| CN | 111697063 | 9/2020 |
| CN | 111883589 | 11/2020 |
| CN | 111987141 | 11/2020 |
| CN | 112119494 | 12/2020 |
| JP | 2010050147 | 3/2010 |

OTHER PUBLICATIONS

English translation of "Written Opinion of the International Searching Authority (Form PCT/ISA/237) of PCT/CN2021/076958", mailed on Nov. 18, 2021, pp. 1-4.

English translation of "International Search Report (Form PCT/ISA/210) of PCT/CN2021/112109", mailed on Nov. 17, 2021, pp. 1-3.

English translation of "Written Opinion of the International Searching Authority (Form PCT/ISA/237) of PCT/CN2021/112109", mailed on Nov. 17, 2021, pp. 1-5.

"Office Action of China Application No. 202180001018.1", issued on Dec. 9, 2021, with Machine/Partial English translation thereof, pp. 1-33.

"Office Action of China Application No. 202180001018.1", issued on Feb. 14, 2022, with Machine/Partial English translation thereof, pp. 1-10.

"Notice of Allowance of China Application No. 202180001018.1", issued on May 5, 2022, with Machine/Partial English translation thereof, pp. 1-7.

"Notice of Allowance of China Application No. 202180004493.4", issued on Nov. 30, 2023, with Machine/Partial English translation thereof, pp. 1-8.

United States Patent and Trademark Office, non-final office action, Office Action Issued in U.S. Appl. No. 17/442,141, filed Oct. 10, 2024, 27 pages.

* cited by examiner

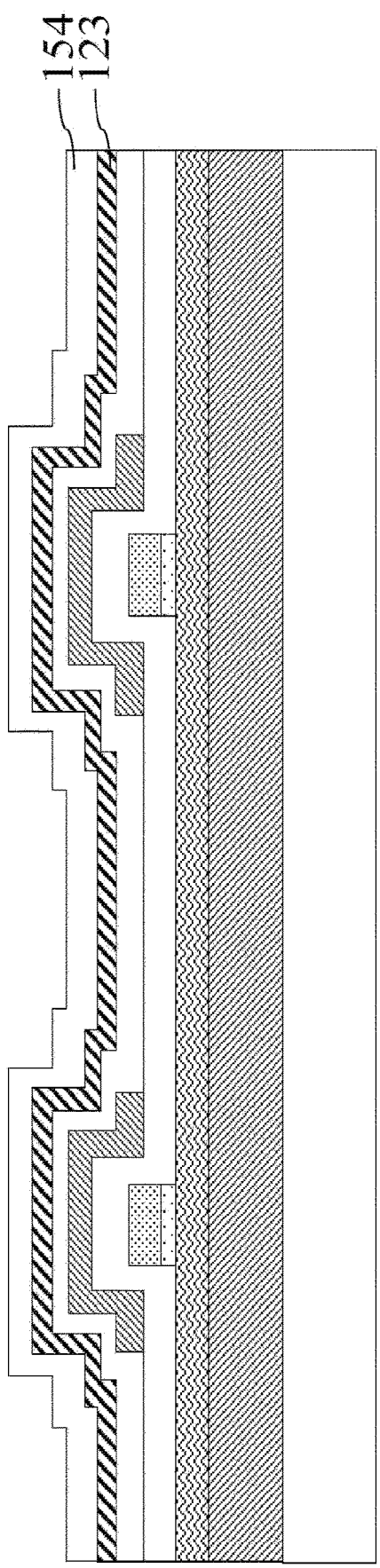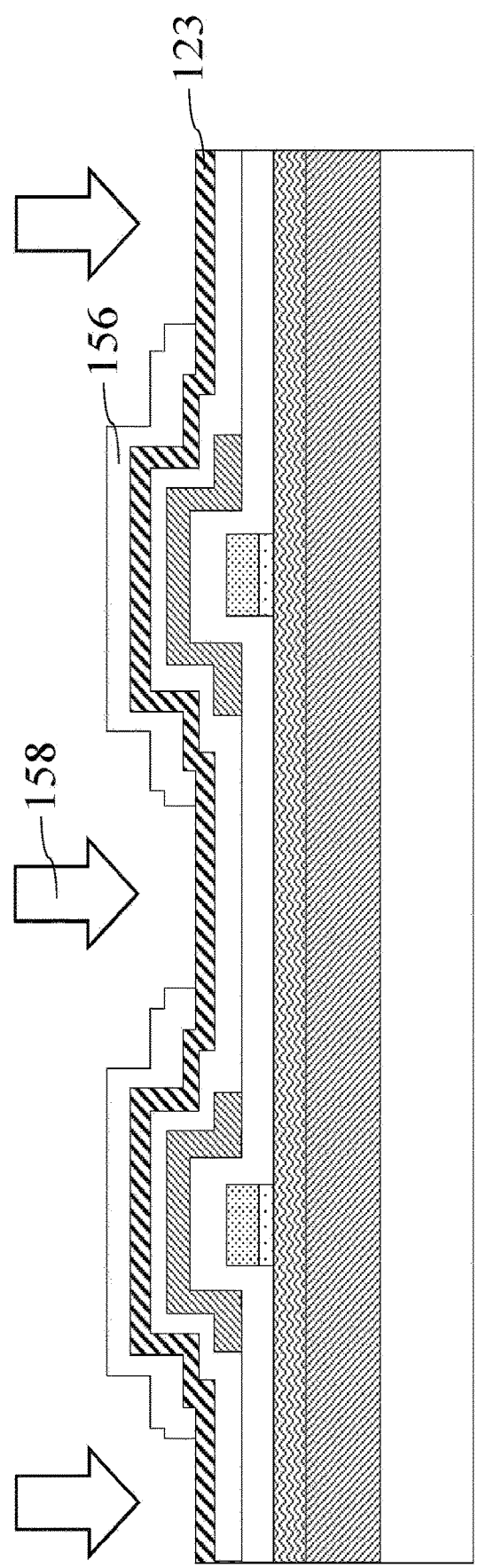

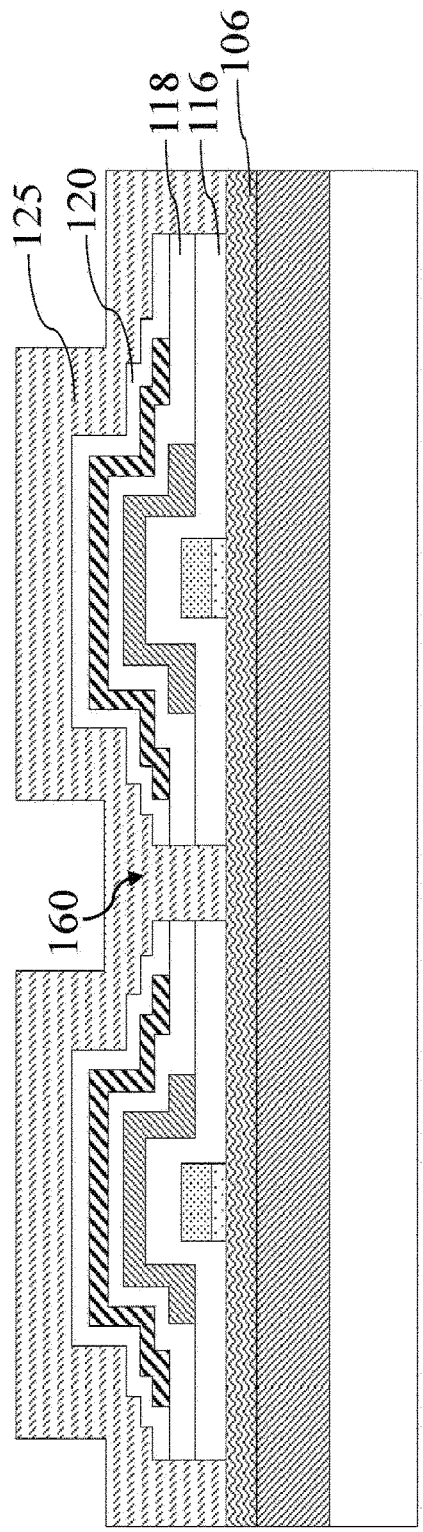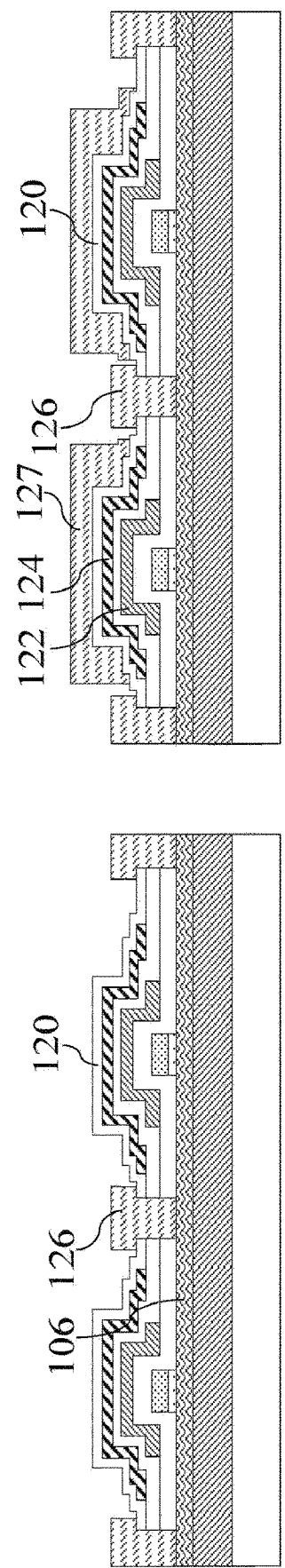
FIG. 3K
FIG. 3L
FIG. 3M

METHOD FOR MANUFACTURING SEMICONDUCTOR DEVICE

CROSS-REFERENCE TO RELATED APPLICATIONS

This application is a divisional application of U.S. patent application Ser. No. 17/275,680, filed on Mar. 12, 2021, which is a national stage of International Application No. PCT/CN2021/076958, filed on Feb. 19, 2021. All of the aforementioned patent applications are hereby incorporated by reference in their entireties.

FIELD OF THE INVENTION

The present invention generally relates to a semiconductor device. More specifically, the present invention relates to a high electron mobility transistor (HEMT) semiconductor device having multi field plates over a gate electrode thereof for improving the performance thereof.

BACKGROUND OF THE INVENTION

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a gate electrode, a first passivation layer, a first field plate, a second passivation layer, and a second field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The first passivation layer is disposed on the second nitride-based semiconductor layer and covers the gate electrode. The first field plate is disposed on the gate electrode and the first passivation layer, in which the first passivation layer has a first portion covered with the first field plate and a second portion free from coverage of the first field plate. The second passivation layer is disposed on the first passivation layer and covers the first field plate. The second field plate is disposed over the first field plate and the second passivation layer. The second passivation layer has a first portion covered with the second field plate and a second portion is free from coverage of the second field plate. A thickness difference between the first and second portions of the first passivation layer is less than a thickness difference between the first and second portions of the second passivation layer.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A gate electrode is formed over the second nitride-based semiconductor layer. A first passivation layer is formed on the second nitride-based semiconductor layer to cover the gate electrode. A first blanket field plate is formed on the first passivation layer. The first blanket field plate is patterned to form a first field plate above the gate electrode using a wet etching process. A second passivation layer is formed on the first passivation layer to cover the first field plate. A second blanket field plate is formed on the second passivation layer. The second blanket field plate is patterned to form a second field plate above the first field plate using a dry etching process.

In accordance with one aspect of the present disclosure, a nitride-based semiconductor device is provided. The nitride-based semiconductor device includes a first nitride-based semiconductor layer, a second nitride-based semiconductor layer, a gate electrode, a first passivation layer, a second passivation layer, a second field plate, and a third passivation layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The first passivation layer is disposed on the second nitride-based semiconductor layer and covers the gate electrode. The first field plate disposed covers a first region of the first passivation layer. The second passivation layer is disposed on the first passivation layer and covering the first field plate, in which the second passivation layer covers a second region of the first passivation layer which abuts against the first region of the first passivation layer. The second field plate covers a first region of the second passivation layer. The third passivation layer is disposed on the second passivation layer and covers the second field plate. The third passivation layer covers a second region of the second passivation layer which abuts against the first region of the second passivation layer. A height difference between the first and second regions of the first passivation layer with respect to the second nitride-based semiconductor layer is less than a height difference between the first and second regions of the second passivation layer with respect to the second nitride-based semiconductor layer.

By applying the above configuration, since the thickness difference between the first and second portions of the first passivation layer would be turned as zero or approximate zero, the layers formed above the first passivation layer after the formation of the first field plate can be located at a position complying to the device design (e.g., the passivation layer 118 and the field plate 124 formed on the first passivation layer), thereby avoiding the performance of the semiconductor device getting reduced.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIGS. 3A-3M illustrate different stages of a method for manufacturing a semiconductor device according to some embodiments of the present disclosure;

DETAILED DESCRIPTION

Figure 1A:
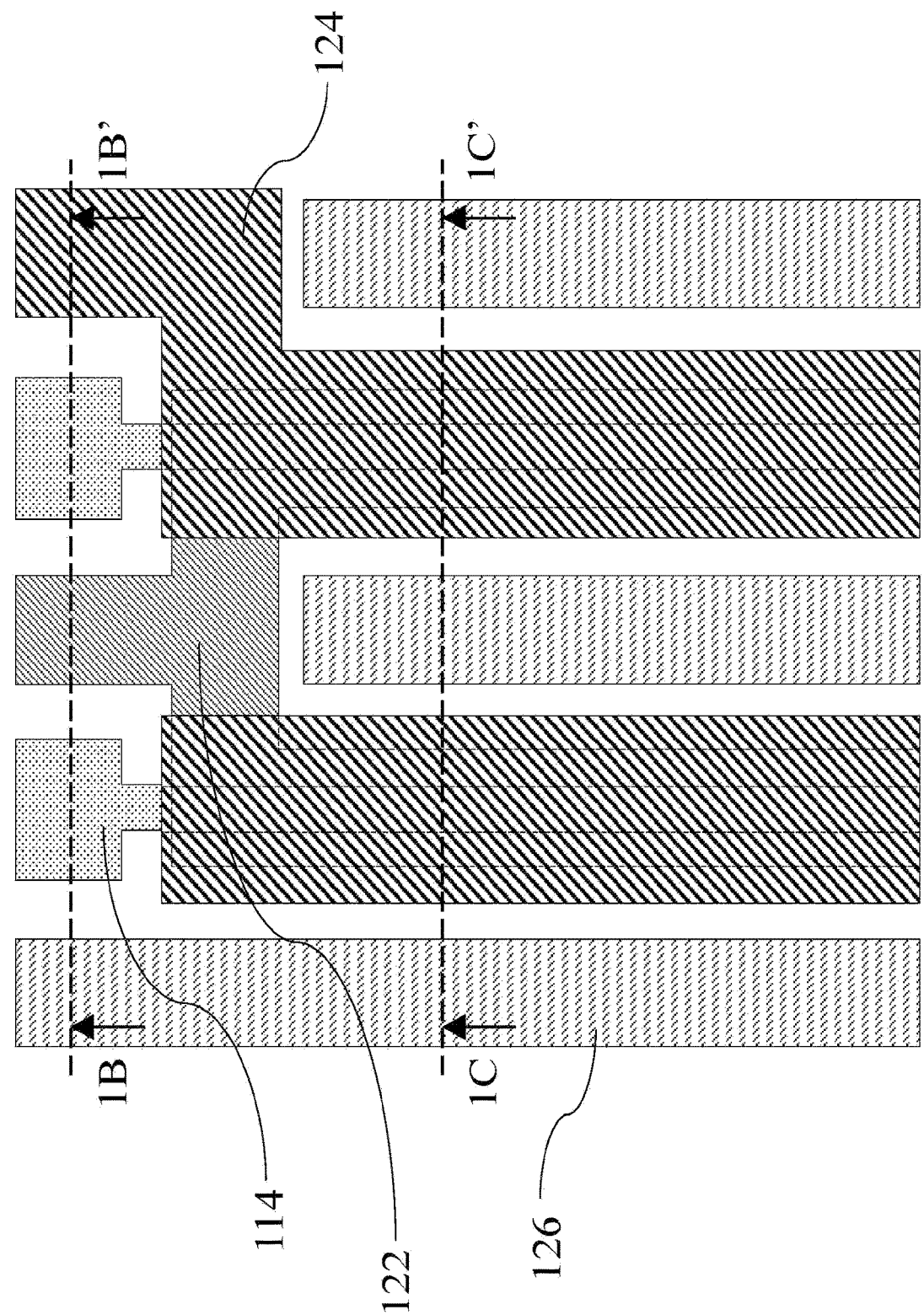
FIG. 1A is a layout of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a layout of a semiconductor device 100A according to some embodiments of the present disclosure. The layout shows a relationship among gate electrodes 114, field plates 122 and 124, and source/drain (S/D) electrodes 126 of the semiconductor device 100A. These elements can constitute parts of transistors in the semiconductor device 100A. The layout reflects a top view of the semiconductor device 100A, which means the layout reflects the gate electrodes 114, the field plates 122 and 124, and the S/D electrodes 126 are formed as layers and viewed along a direction normal to these layers. More structural details of the semiconductor device 100A are provided as follows.

Figure 1B:
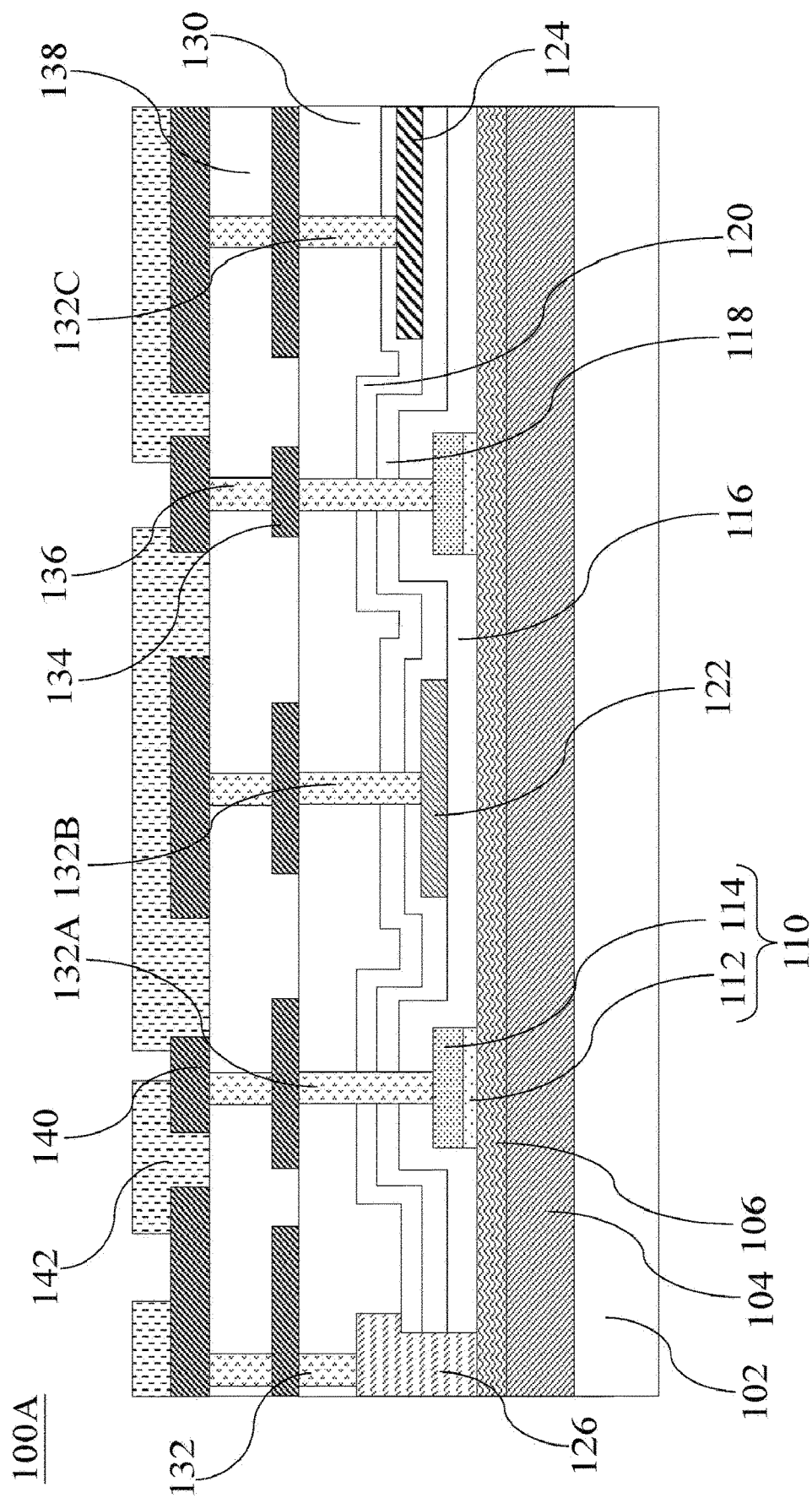
FIGS. 1B and 1C are cross-sectional views across a line 1B-1B' and a line 1C-1C' of the semiconductor device in FIG. 1A.
Figure 1C:
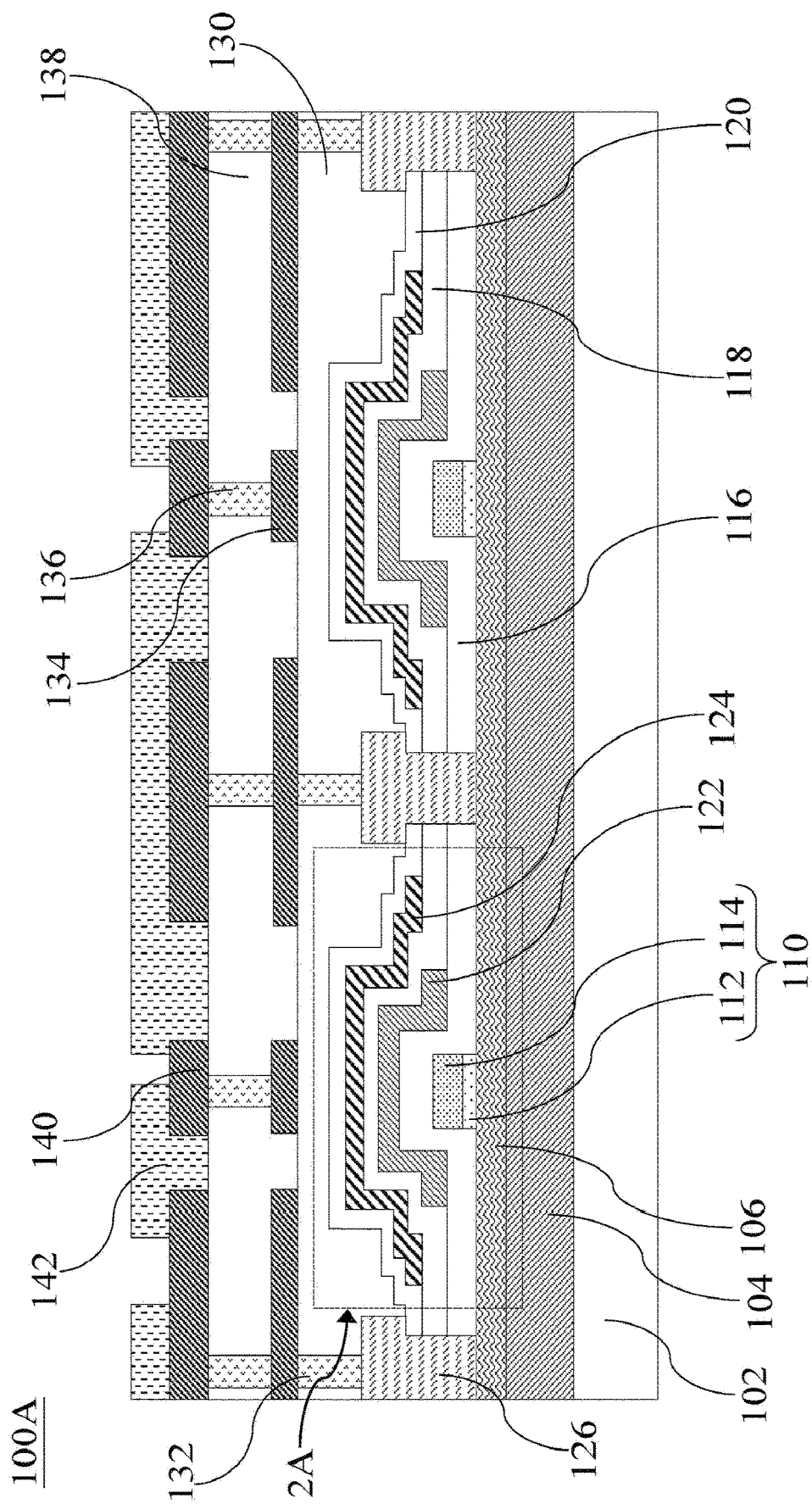

To illustrate, FIGS. 1B and 1C are cross-sectional views across a line 1B-1B' and a line 1C-1C' of the semiconductor device 100A in FIG. 1A. The semiconductor device 100A further includes a substrate 102, nitride-based semiconductor layers 104 and 106, gate structures 110, passivation layers 116, 118, 120, 130, 138, vias 132, 136, patterned conductive layers 134, 140, and a protection layer 142.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 104 is disposed over the substrate 102. The exemplary materials of the nitride-based semiconductor layer 104 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$. The nitride-based semiconductor layer 106 is disposed on the nitride-based semiconductor layer 104. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 100A is available to include at least one GaN-based high-electron-mobility transistor (HEMT).

In some embodiments, the semiconductor device 100A may further include a buffer layer, a nucleation layer, or a combination thereof (not illustrated). The buffer layer can be disposed between the substrate 102 and the nitride-based semiconductor layer 104. The buffer layer can be configured to reduce lattice and thermal mismatches between the substrate 102 and the nitride-based semiconductor layer 104, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof. The nucleation layer may be formed between the substrate 102 and the buffer layer. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The gate structures 110 are disposed on/over/above the nitride-based semiconductor layer 106. Each of the gate structures 110 may include an optional p-type doped III-V compound semiconductor layer 112 and the gate electrode 114 which is mentioned in FIG. 1A. The p-type doped III-V compound semiconductor layers 112 and the gate electrodes 114 are stacked on the nitride-based semiconductor layer 106. The p-type doped III-V compound semiconductor layers 112 are between the nitride-based semiconductor layer 106 and the gate electrodes 114. In some embodiments, each of the gate structures 110 may further include an optional dielectric layer (not illustrated) between the p-type doped III-V compound semiconductor layer 112 and the gate electrode 114.

In the exemplary illustration of FIGS. 1B and 1C, the semiconductor device 100A is an enhancement mode device, which is in a normally-off state when the gate electrodes 114 are at approximately zero bias. Specifically, the p-type doped III-V compound semiconductor layers 112 may create at least one p-n junction with the nitride-based semiconductor layer 106 to deplete the 2DEG region, such that at least one zone of the 2DEG region corresponding to a position below the corresponding gate structure 110 has different characteristics (e.g., different electron concentrations) than the rest of the 2DEG region and thus is blocked. Due to such mechanism, the semiconductor device 100A has a normally-off characteristic. In other words, when no voltage is applied to the gate electrodes 114 or a voltage applied to the gate electrodes 114 is less than a threshold voltage (i.e., a minimum voltage required to form an inversion layer below the gate structures 110), the zone of the 2DEG region below the gate structures 110 is kept blocked, and thus no current flows therethrough. Moreover, by providing the p-type doped III-V compound semiconductor layers 112, gate leakage current is reduced and an increase in the threshold voltage during the off-state is achieved.

In some embodiments, the p-type doped III-V compound semiconductor layers 112 can be omitted, such that the semiconductor device 100A is a depletion-mode device, which means the semiconductor device 100A in a normally-on state at zero gate-source voltage.

The exemplary materials of the p-type doped III-V compound semiconductor layers 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 104 includes undoped GaN and the nitride-based semiconductor layer 106 includes AlGaN, and the p-type doped III-V compound semiconductor layers 112 are p-type GaN layers which can bend the underlying band structure upwards and to deplete the corresponding zone of the 2DEG region, so as to place the semiconductor device 100A into an off-state condition. In some embodiments, the gate electrodes 114 may include metals or metal compounds. The gate electrodes 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 114 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The S/D electrodes 126 are disposed on the nitride-based semiconductor layer 106. The "S/D" electrode means each of the S/D electrodes 126 can serve as a source electrode or a drain electrode, depending on the device design. The S/D electrodes 126 can be located at two opposite sides of the corresponding gate structure 110 although other configurations may be used, particularly when plural source, drain, or gate electrodes are employed in the device. Each of the gate structure 110 can be arranged such that each of the gate structure 110 is located between the at least two of the S/D electrodes 126. The gate structures 110 and the S/D electrodes 126 can collectively act as at least one nitride-based/GaN-based HEMT with the 2DEG region, which can be called a nitride-based/GaN-based semiconductor device. In the exemplary illustration of FIG. 1C, the pair of the adjacent S/D electrodes 126 are symmetrical about the gate structure 110 therebetween. In some embodiments, the pair of the adjacent S/D electrodes 126 can be optionally asymmetrical about the gate structure 110 therebetween. That is, one of the S/D electrodes 126 may be closer to the gate structure 110 than another one of the S/D electrodes 126.

In some embodiments, the S/D electrodes 126 can include, for example but are not limited to, metals, alloys, doped semiconductor materials (such as doped crystalline silicon), compounds such as silicides and nitrides, other conductor materials, or combinations thereof. The exemplary materials of the S/D electrodes 126 can include, for example but are not limited to, Ti, AlSi, TiN, or combinations thereof. The S/D electrodes 126 may be a single layer, or plural layers of the same or different composition. In some embodiments, the S/D electrodes 126 form ohmic contact with the nitride-based semiconductor layer 106. The ohmic contact can be achieved by applying Ti, Al, or other suitable materials to the S/D electrodes 126. In some embodiments, each of the S/D electrodes 126 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layers 116, 118, 120 are disposed over the nitride-based semiconductor layer 106. The passivation layers 116, 118, 120 are sequentially stacked on the nitride-based semiconductor layer 106. The passivation layers 116, 118, 120 can be formed for a protection purpose or for enhancing the electrical properties of the device (e.g., by providing an electrically isolation effect between/among different layers/elements). The passivation layer 116 covers a top surface of the nitride-based semiconductor layer 106. The passivation layer 116 may cover the gate structures 110. The passivation layer 116 can at least cover opposite two sidewalls of the gate structures 110. The S/D electrodes 126 can penetrate/pass through the passivation layers 116, 118, 120 to contact the nitride-based semiconductor layer 106. The exemplary materials of the passivation layers 116, 118, 120 can include, for example but are not limited to, $SiN_x$, $SiO_x$, $Si_3N_4$, SiON, SiC, SiBN, SiCBN, oxides, nitrides, poly(2-ethyl-2-oxazoline) (PEOX), or combinations thereof. In some embodiments, at least one of the passivation layers 116, 118, 120 can be a multi-layered structure, such as a composite dielectric layer of $Al_2O_3$/SiN, $Al_2O_3$/$SiO_2$, AlN/SiN, AlN/$SiO_2$, or combinations thereof.

The field plates 122 and 124 are disposed over the gate structures 110. The field plate 122 is located between the passivation layers 116 and 118. The field plate 124 is located between the passivation layers 118 and 120. That is, the passivation layer 116, the field plate 122, the passivation layer 118, the field plate 124, and the passivation layer 120 are sequentially stacked/formed on the nitride-based semiconductor layer 106. Each of the field plates 122 and 124 is located between at least two of the S/D electrodes 126. The exemplary materials of the field plates 122 and 124 can include, for example but are not limited to, conductive materials, such as Ti, Ta, TiN, TaN, or combinations thereof. In some embodiments, other conductive materials such as Al, Cu doped Si, and alloys including these materials may also be used.

The process for forming the field plate 122 can be different than that of the field plate 124, which is advantageous to the improvement in the electrical character of the semiconductor device 100A. One of the reasons is that such approach can avoid the semiconductor device 100A having a configuration turning away from the design thereof.

For example, with respect to a semiconductor device including a stack structure that is formed by a bottom passivation layer, a bottom field plate, a top passivation layer, and a top field plate. The formation of the bottom field plate may include patterning a blanket conductive layer to form the bottom field plate. However, during the patterning, some portion of the bottom passivation layer would be removed (the portions near a top surface of the bottom passivation layer), resulting in a reduced thickness of the bottom passivation layer. Accordingly, the top passivation layer and the top field plate on the bottom passivation layer will be formed at a position lower than the design position due to the reduced thickness of the bottom passivation layer. As such, the stability of the semiconductor device is affected and the performance of semiconductor device have reduced.

Figure 2:
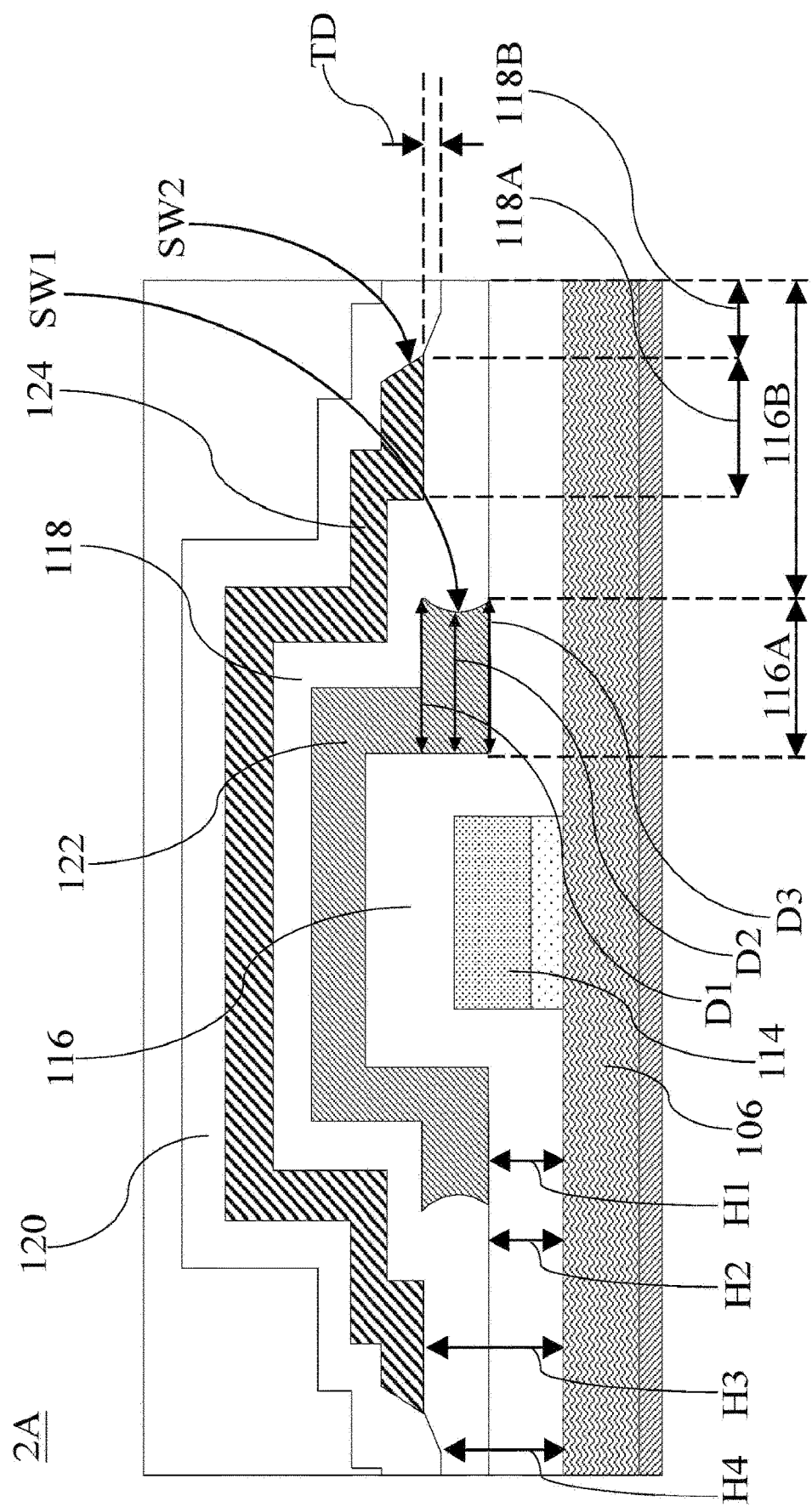
FIG. 2 is an enlarged view of a zone in FIG. 1C.

Referring to FIG. 2, which is an enlarged view of a zone 2A in FIG. 1C, the illustration shows the detailed structural features resulted from the different processes for forming the field plates 122 and 124.

The passivation layer 116 is disposed on the nitride-based semiconductor layer 106. The passivation layer 116 covers the gate electrode 114. As such, the passivation layer 116 is conformal with the gate electrode 114, so as to form a protruding portion above the nitride-based semiconductor layer 106 with the gate electrode 114.

The field plate 122 is disposed on the gate electrode 114 and the passivation layer 116. At least one portion of the passivation layer 116 is covered with the field plate 122, and the rest of the passivation layer 116 is free from coverage of the field plate 122 (but still can be covered by other layers). To illustrate, the passivation layer 116 has a portion 116A covered with the field plate 122 and a portion 116B free from the coverage of the field plate 122. Furthermore, the field plate 122 laterally spans the gate electrode 114. More specifically, in the cross-sectional view as FIG. 2, a vertical projection of the gate electrode 114 on the nitride-based semiconductor layer 106 is entirely within a vertical projection of the field plate 122 on the nitride-based semiconductor layer 106. The reason for such configuration is that an electric field distribution in a lateral HEMT device may be not uniform at an operation condition. The electric field will reach maximum at a gate edge toward a drain, which leads to breakdown and current collapse. Accordingly, the field plate design is implemented to reduce the peak electric field at the gate edge, improving uniformity of electric field distribution and hence increasing breakdown voltage.

The passivation layer 118 is disposed on the passivation layer 116 and covers the field plate 122. The passivation layer 118 covers the portion 116B of the passivation layer 116. More specifically, the passivation layer 116 can have two regions abutting against each other, one of the regions is covered with the field plate 122 and another one is free from the coverage of the field plate 122 but covered with the passivation layer 118.

The second field plate 124 is disposed over the field plate 122 and the passivation layer 118. At least one portion of the passivation layer 118 is covered with the field plate 124, and the rest of the passivation layer 118 is free from coverage of the field plate 124 (but still can be covered by other layers). To illustrate, the passivation layer 118 has a portion 118A covered with the field plate 124 and a portion 118B free from the coverage of the field plate 124. Furthermore, the field plate 124 laterally spans the gate electrode 114. The field plate 124 further laterally spans the field plate 122. That is, the field plate 124 can laterally span an interface between the portions 116A and 116B of the passivation layer 116, and thus the field plate 124 is directly above the interface between the portions 116A and 116B. More specifically, in the cross-sectional view as FIG. 2, the vertical projection of the gate electrode 114 on the nitride-based semiconductor layer 106 is entirely within a vertical projection of the field plate 124 on the nitride-based semiconductor layer 106. In the cross-sectional view as FIG. 2, the vertical projection of the field plate 124 on the nitride-based semiconductor layer 106 is entirely within a vertical projection of the field plate 124 on the nitride-based semiconductor layer 106. That is, the field plate 124 further extends laterally than the field plate 122 to reduce the peak electric field at an edge of the field plate 122. The reason is similar with the afore-mentioned one. Due to the further extending of the field plate 124, the interface between the portions 116A and 116B of the passivation layer 116 is closer to the gate electrode 114 than the interface between the portions 118A and 118B of the passivation layer 118, which will be advantageous to cure the peak electric field at an edge of the field plate 122 by the field plate 124.

In some embodiments, the field plate 122 has approximately the same thickness as a thickness of the field plate 124. In some embodiments, the field plate 122 has a thickness greater than a thickness of the field plate 124. In some embodiments, the field plate 122 has a thickness less than a thickness of the field plate 124. The thickness relationship between the field plates 122 and 124 may depend on the practical requirements, such as the design on the distribution of the electric field or the process conditions.

The passivation layer 120 is disposed on the passivation layer 118 and covers the field plate 124. The passivation layer 120 covers the portion 118B of the passivation layer 118. More specifically, the passivation layer 118 can have two regions abutting against each other, one of the regions is covered with the field plate 124 and another one is free from the coverage of the field plate 124 but covered with the passivation layer 120.

Regarding at least one difference between the processes for forming the field plates 122 and 124, they are patterned by different approaches. The patterning of the field plate 122 can be achieved by using a wet etching process, and the patterning of the field plate 124 can be achieved by using a dry etching process. In this regard, a chemical process of the wet etching can provide a high etch selectivity. The high etch selectivity means that the etch rate is stronger with respect to the target material but weaker with respect to the non-target material. In contrast, dry etching has a drawback of low selectivity. One of the reasons for using dry etching for patterning the field plate 124 is that dry etching involves ion bombardment, such as reactive-ion etching (RIE), and features fast etching and is controllable with respect to the target material. Although dry etching has a low selectivity, the tradeoff between the low selectivity and above advantages can provide a positive effect for the second lowest field plate (i.e., the field plate 124).

In this regard, during the patterning of field plate 122, the passivation layer 116 (e.g., the portion 116B thereof) can be free from etching and thus the morphological profile thereof would be retained. As such, after patterning the field plate 122, the thickness of the portion 116A of the passivation layer 116 can be kept the same or almost the same (i.e., the reduced quantity is negligible). On the other hand, during patterning of the field plate 124, the passivation layer 118 (e.g., the portion 118B thereof) is etched as it is exposed from the field plate 124, which is called over-etching, which would change the morphological profile thereof. As such, after the patterning the field plate 124, the thickness of the portion 118B of the passivation layer 118 is significantly reduced. Although the over-etching occurs across the passivation layer 118, the vertical locations of the field plates 122 and 124 have been constructed such that over-etching would not significantly affect the performance of the semiconductor device 100A. However, since the dry etching for pattering the field plate 124 has the favorable controllability, the efficiency of the process for manufacturing the semiconductor device 100A can be increased (e.g., speeding up the manufacturing process).

Regarding over-etching, the etched portion 118B of the passivation layer 118 will have a side surface and a top surface. The side surface of the portion 118B is located between the portion 118A and the top surface of the portion 118A. The side surface of the portion 118B forms an obtuse angle with the top surface of the portion 118B. The top surface of the portion 118B is in a position lower than the side surface of the portion 118B. The passivation layer 120 is formed to cover the side surface and the top surface of the portion 118B, so as to form an interface/a contact area therebetween. The interface/contact area therebetween is in a position lower than the portion 118A.

As such, after the formation of the field plate 122, a thickness difference between the portions 116A and 116B of the passivation layer 116 is zero or approximate zero. After the formation of the field plate 124, a thickness difference between the portions 118A and 118B of the passivation layer 116 is significantly greater than zero, which is labeled as a thickness difference TD in FIG. 2. Accordingly, the thickness difference between the portions 116A and 116B of the passivation layer 116 is less than the thickness difference TD between the portions 118A and 118B of the passivation layer 118. Since the thickness difference between the portions 116A and 116B of the passivation layer 116 is zero or approximate zero, the layers formed above the passivation layer 116 after the formation of the field plate 122 can be located at a position complying to the device design (e.g., the passivation layer 118 and the field plate 124), thereby avoiding a deleterious impact on the performance of the semiconductor device 100A.

In other words, with respect to the nitride-based semiconductor layer 106, a region of the passivation layer 116 is covered by the edge of the field plate 122 at a height H1; a region of the passivation layer 116 that is free from the coverage of the field plate 122 has a height H2; a region of the passivation layer 118 covered by the edge of the field plate 124 has a height H3; a region of the passivation layer 118 free from the coverage of the field plate 124 has a height H4; and a difference between the heights H1 and H2 is less than a difference between the heights H3 and H4.

Furthermore, the difference between wet and dry etching creates a different profile of the field plates 122 and 124 at their edges/sidewalls. The field plate 122 has a sidewall SW1 extending upward from the passivation layer 116. The sidewall SW1 of the field plate 122 is recessed inward to receive the passivation layer 118. The field plate 124 has an oblique sidewall SW2 approximately ending at an interface between the portions 118A and 118B of the passivation layer 118. The reason for such difference relates to isotropic etching and anisotropic etching, which results from wet etching and dry etching, respectively. For example, the field plates 122 and 124 can be formed by patterning two blanket conductive layers having the same conductive material, respectively, while the patterning process are performed by wet etching and dry etching. As a result, the field plates 122 and 124 can have the same conductive material, and the sidewall SW1 of the field plate 122 has a profile different than that of the oblique sidewall SW2 of the field plate 124. Moreover, the field plates 122 and 124 may have different roughnesses. In some embodiments, a surface roughness of the oblique sidewall SW2 is greater than a surface roughness of the sidewall SW1. Herein, the surface roughness refers to a component of surface texture (i.e., the dimension would be much smaller than the layer thickness thereof).

As the sidewall SW1 of the field plate 122 is formed by the isotropic process of the wet etching, the sidewall SW1 of the field plate 122 is curved. For example, from a top surface to a bottom surface of the field plate 122, a distance between the sidewall SW1 of field plate 122 and the protruding portion (i.e., formed by the gate electrode 114 and the passivation layer 116) decreases and then increases, as shown by distances D1, D2, and D3 in FIG. 2. The relationship among the distances D1-D3 is D1>D2 and D3>D2.

As the sidewall SW2 of the field plate 124 is formed by the anisotropic process of the dry etching, the sidewall SW2 of the field plate 124 is flat and oblique. For example, the oblique sidewall SW2 of the field plate 124 extends upward from the passivation layer 118 and is oblique with respect to a top surface of the passivation layer 118 (e.g., a top surface of the portion 118A or the side surface of the portion 118B of the passivation layer 118). Furthermore, since over-etching occurs at the portion 118B of the passivation layer 118, the side surface and the top surface of the portion 118B of the passivation layer 118 are lower than the oblique sidewall SW2 of the field plate 124. The side surface of the portion 118B may have a flat and oblique profile. The side surface of the portion 118B may extend obliquely from the oblique sidewall SW2 to a position lower than the top surface of the portion 118A. The degree of obliqueness in the oblique sidewall SW2 and the side surface of the portion 118B may be different, which results from the etching selectivity therebetween (i.e., the field plate 124 and the passivation layer 118 having different etching rates with respect to the same etchant).

Referring to FIGS. 1B and 1C again, the passivation layer 130 is disposed above the passivation layer 120 and the S/D electrodes 126. The passivation layer 130 covers the passivation layer 120 and the S/D electrodes 126. The passivation layer 130 can serve as a planarization layer which has a level top surface to support other layers/elements. In some embodiments, the passivation layer 130 can be formed as being thicker, and a planarization process, such as chemical mechanical polish (CMP) process, is performed on the passivation layer 130 to remove the excess portions, thereby forming a level top surface. The exemplary materials of the passivation layer 130 can include, for example but are not limited to, $SiN_x$, $SiO_x$, $Si_3N_4$, SiON, SiC, SiBN, SiCBN, oxides, PEOX, or combinations thereof. In some embodiments, the passivation layer 130 is a multi-layered structure, such as a composite dielectric layer of $Al_2O_3$/SiN, $Al_2O_3$/$SiO_2$, AlN/SiN, AlN/$SiO_2$, or combinations thereof.

The vias 132 are disposed within the passivation layer 130. The vias 132 penetrate the passivation layer 130. The vias 132 extend longitudinally to electrically couple with the gate structure 110, the field plates 122 and 124, and the S/D electrodes 126, respectively. The upper surfaces of the vias 132 are free from coverage of the passivation layer 130. The exemplary materials of the vias 132 can include, for example but are not limited to, conductive materials, such as metals or alloys.

A patterned conductive layer 134 is disposed on the passivation layer 130 and the vias 132. The patterned conductive layer 134 is in contact with the vias 132. The patterned conductive layer 134 may have metal lines, pads, traces, or combinations thereof, such that the patterned conductive layer 134 can form at least one circuit. The exemplary materials of the patterned conductive layer 134 can include, for example but are not limited to, conductive materials. The patterned conductive layer 134 may include a single film or multilayered film having Ag, Al, Cu, Mo, Ni, Ti, alloys thereof, oxides thereof, nitrides thereof, or combinations thereof.

The passivation layer 138 is disposed above the passivation layer 130 and the patterned conductive layer 134. The passivation layer 138 covers the passivation layer 130 and the patterned conductive layer 134. The passivation layer 138 can serve as a planarization layer which has a level top surface to support other layers/elements. In some embodiments, the passivation layer 138 can be formed as being thicker, and a planarization process, such as CMP process, is performed on the passivation layer 138 to remove the excess portions, thereby forming a level top surface. The exemplary materials of the passivation layer 138 can include, for example but are not limited to, $SiN_x$, $SiO_x$, $Si_3N_4$, SiON, SiC, SiBN, SiCBN, oxides, PEOX, or combinations thereof. In some embodiments, the passivation layer 138 is a multi-layered structure, such as a composite dielectric layer of $Al_2O_3$/SiN, $Al_2O_3$/$SiO_2$, AlN/SiN, AlN/$SiO_2$, or combinations thereof.

The vias 136 are disposed within the passivation layer 138. The vias 136 penetrate the passivation layer 138. The vias 136 extend longitudinally to electrically couple with the patterned conductive layer 134. The upper surfaces of the vias 136 are free from coverage of the passivation layer 136. The exemplary materials of the vias 136 can include, for example, but are not limited to, conductive materials, such as metals or alloys.

A patterned conductive layer 140 is disposed on the passivation layer 138 and the vias 136. The patterned conductive layer 140 is in contact with the vias 136. The patterned conductive layer 140 may have metal lines, pads, traces, or combinations thereof, such that the patterned conductive layer 140 can form at least one circuit. The exemplary materials of the patterned conductive layer 140 can include, for example but are not limited to, conductive materials. The patterned conductive layer 140 may include a single film or multilayered film having Ag, Al, Cu, Mo, Ni, Ti, alloys thereof, oxides thereof, nitrides thereof, or combinations thereof.

The circuit of the patterned conductive layer 134 or 140 can connect different layers/elements, making these layers or elements have the same electrical potential. For example, the vias 132A, 132B, and 132C are disposed on and electrically coupled to the gate electrode 114, the field plate 122, and the field plate 124, respectively. By such connection, the gate electrode 114, the field plate 122, and the field plate 124 can be electrically connected to each other via the circuit of the patterned conductive layer 134 to have the same electrical potential, and thus the field plates 122 and 124 can act as gate field plates.

The protection layer 142 is disposed above the passivation layer 138 and the patterned conductive layer 140. The protection layer 142 covers the passivation layer 138 and the patterned conductive layer 140. The protection layer 142 can prevent the patterned conductive layer 140 from oxidizing. Some portions of the patterned conductive layer 140 can be exposed through openings in the protection layer 142, which are configured to electrically connect to external elements (e.g., an external circuit).

Different stages of a method for manufacturing the semiconductor device 100A are shown in FIGS. 3A-3M, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3A:
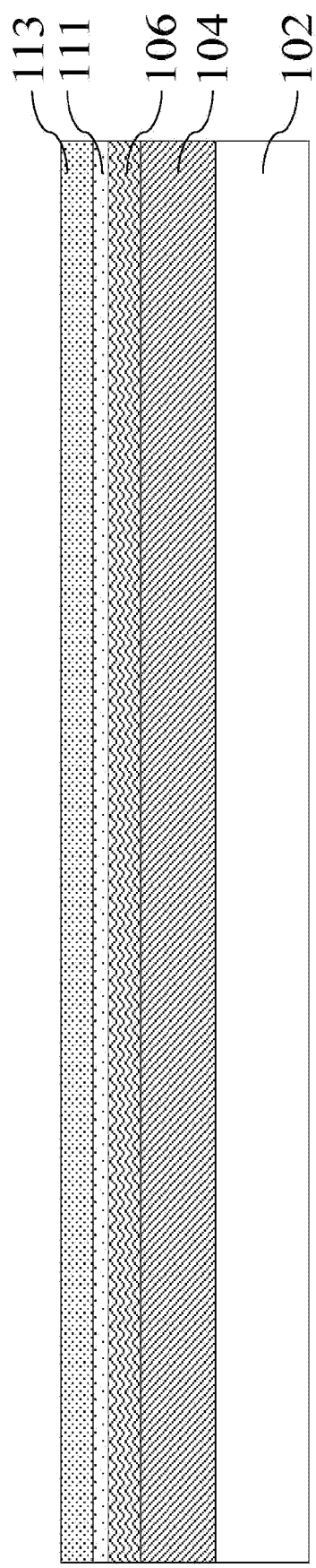

Referring to FIG. 3A, a substrate 102 is provided. Nitride-based semiconductor layers 104 and 106 can be formed over the substrate 102 in sequence by using the above-mentioned deposition techniques. A blanket p-type doped III-V compound semiconductor layer 111 and a blanket conductive layer 113 can be formed above the nitride-based semiconductor layer 106 in sequence by using the above-mentioned deposition techniques.

Figure 3B:
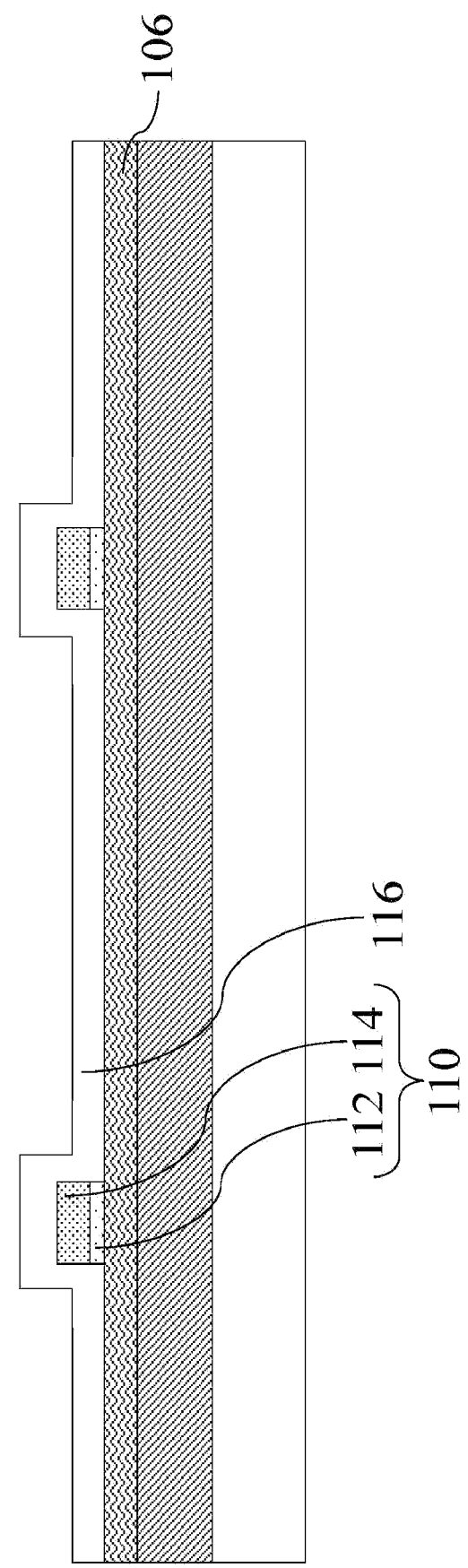

Referring to FIG. 3B, the blanket p-type doped III-V compound semiconductor layer 111 and the blanket conductive layer 113 are patterned to form a plurality of gate structures 110 over the nitride-based semiconductor layer 106. Each of the gate structures 110 includes a p-type doped III-V compound semiconductor layer 112 and a gate electrode 114. The patterning process can be performed by photolithography, exposure and development, etching, other suitable processes, or combinations thereof. A passivation layer 116 can be formed to cover the of the gate structures 110 by using the above-mentioned deposition techniques. By covering the gate structures 110, the passivation layer 116 can form a plurality of protruding portions above the nitride-based semiconductor layer 106 with the gate electrode 114.

Figure 3C:
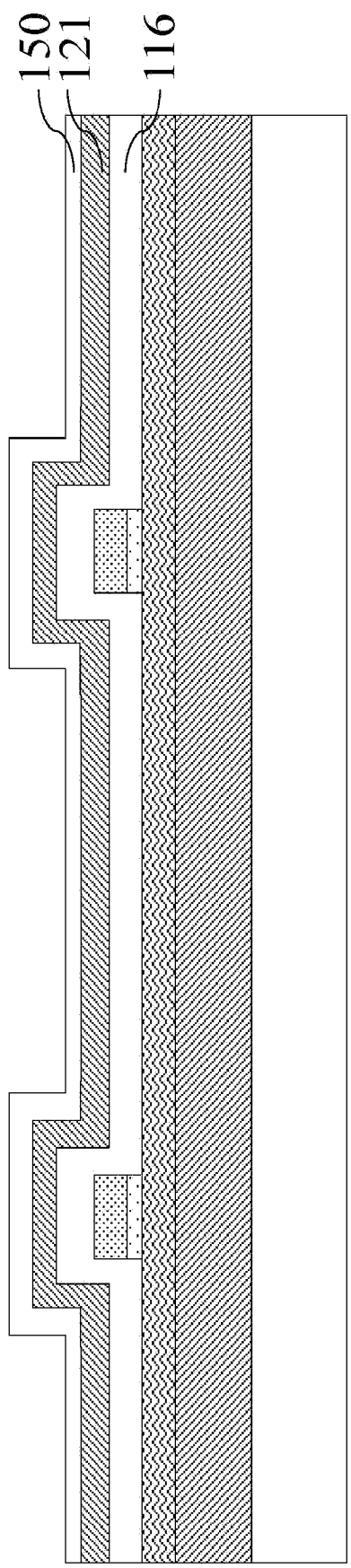

Referring to FIG. 3C, a blanket conductive layer 121 and a mask layer 150 can be formed above the passivation layer 116 in sequence by using the above-mentioned deposition techniques. The mask layer 150 can serve as a wet-etching mask for the blanket conductive layer 121 during patterning the same. In some embodiments, the blanket conductive layer 121 is made of TiN and the mask layer 150 is made of $SiO_x$ (e.g., $SiO_2$).

Figure 3D:
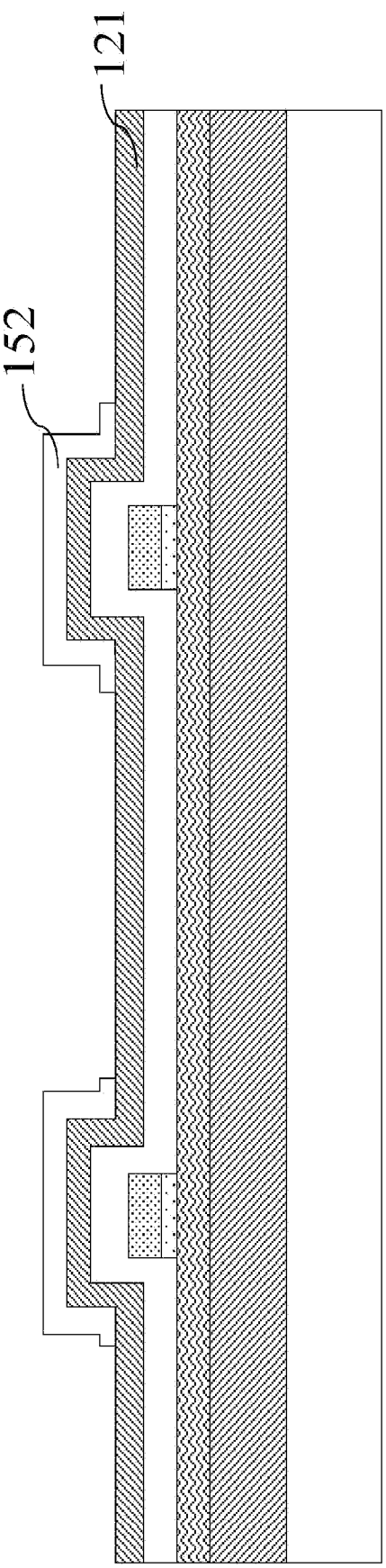

Referring to FIG. 3D, the mask layer 150 is patterned to form a mask layer 152 having openings. Some portions of the blanket conductive layer 121 are exposed from the openings of the mask layer 152. The profile of the mask layer 152 can be transferred to the blanket conductive layer 121 by performing a patterning process.

Figure 3E:
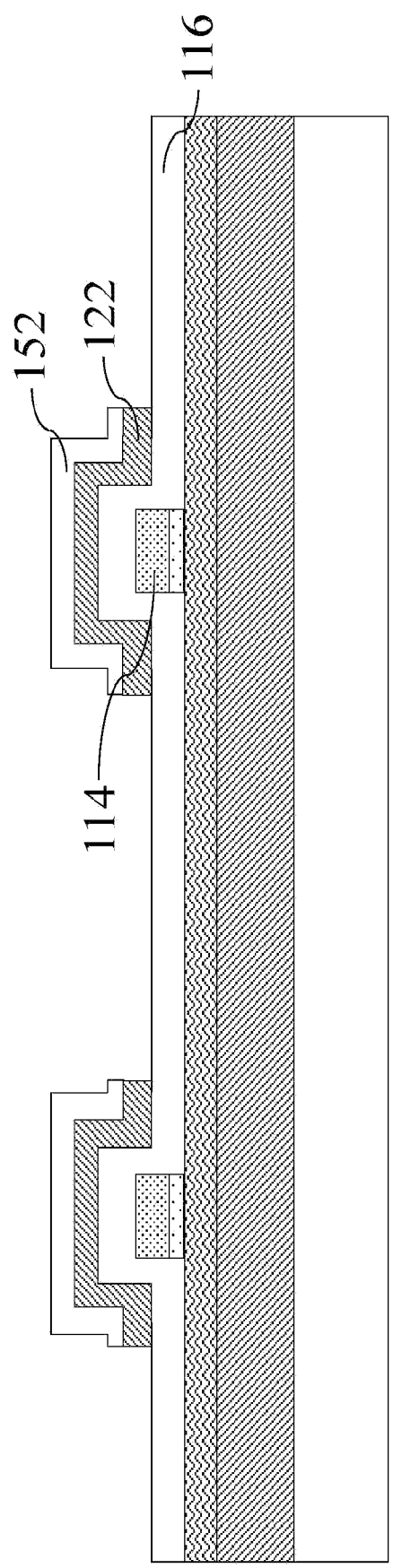

Referring to FIG. 3E, the blanket conductive layer 121 is patterned to form field plates 122 above the gate electrodes 114. The field plates 122 have a profile similar to that of the mask layer 150 such that the field plates 122 can laterally span across the corresponding gate electrodes 114. The patterning process can be performed by a wet etching process. During the wet etching process, the mask layer 152 can protect portions of the underlying blanket conductive layer 121. Accordingly, the portions of the blanket conductive layer 121 exposed from the openings of the mask layer 152 are removed. As afore-mentioned, the wet etching process can provide a high selectivity, so no over-etching would occur at the passivation layer 116 and thus the thickness of the passivation layer 116 can be kept the same or almost the same. In some embodiments, the blanket conductive layer 121 is made of TiN and the passivation layer 116 is made of $Si_3N_4$, such that they can have a high selectivity with respect to the same etchant during a wet etching process.

Figure 3F:
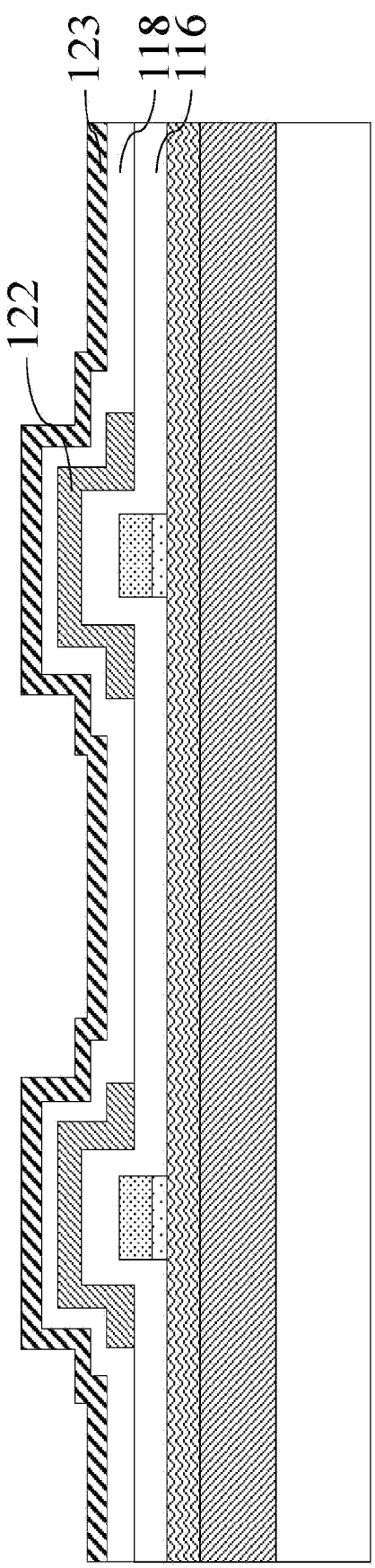

Referring to FIG. 3F, the mask layer 152 is removed. Then, a passivation layer 118 and a blanket conductive layer 123 can be formed over the passivation layer 116 and the field plates 122 in sequence by using the above-mentioned deposition techniques. The passivation layer 118 can be formed to cover the passivation layer 116 and the field plates 122. The blanket conductive layer 123 can be formed to cover the passivation layer 118.

Referring to FIG. 3G, a mask layer 154 can be formed above/over/on the blanket conductive layer 123 by using the above-mentioned deposition techniques. The mask layer 154 can serve as a dry-etching mask for the blanket conductive layer 123 during patterning the same. In some embodiments, the blanket conductive layer 121 is made of TiN and the mask layer 154 is made of made of light-sensitive materials, such as a composition of a polymer, a sensitizer, and a solvent.

Referring to FIG. 3H, the mask layer 154 is patterned to form a mask layer 156 having openings. Some portions of the blanket conductive layer 123 are exposed from the openings of the mask layer 156. The profile of the mask layer 156 can be transferred to the blanket conductive layer 123 by performing a patterning process. In the exemplary illustration of FIG. 3H, the patterning process can be performed by using a dry etching process. For example, the dry etching process is a RIE process, which applies high-energy ions 158 from a plasma source to attack the exposed portions of the blanket conductive layer 123 and react with it for removing the same, so as to achieve patterning. After patterning, field plates 124 are formed from the blanket conductive layer 123.

Figure 3I:
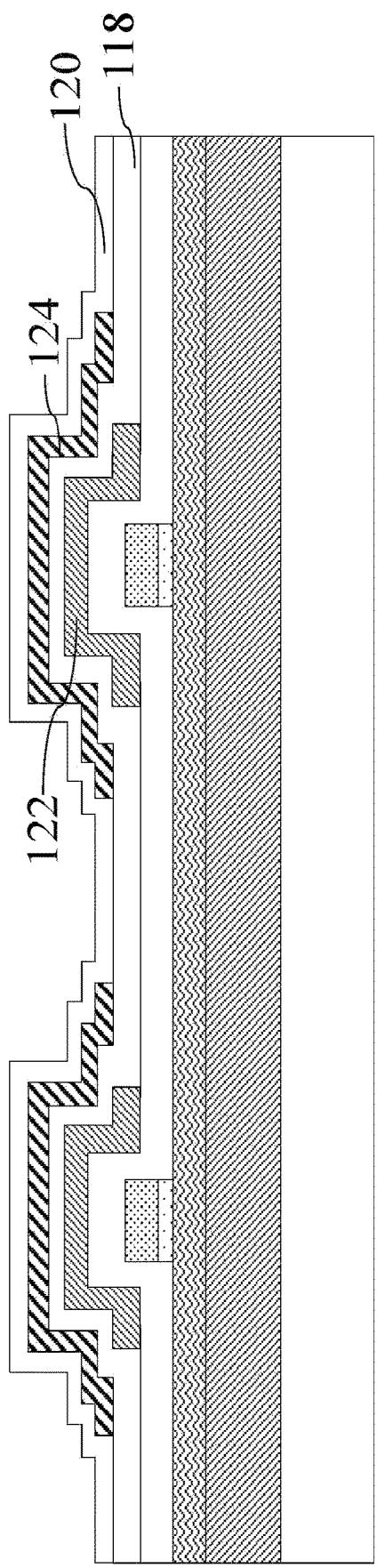

Referring to FIG. 3I, after patterning, the mask layer 156 is removed. The field plates 124 are formed above the field plate 122. The field plates laterally span across the field plate 122. Then, a passivation layer 120 can be formed over the passivation layer 118 and the field plates 124 by using the above-mentioned deposition techniques. The passivation layer 120 can be formed to cover the passivation layer 118 and the field plates 124.

Figure 3J:
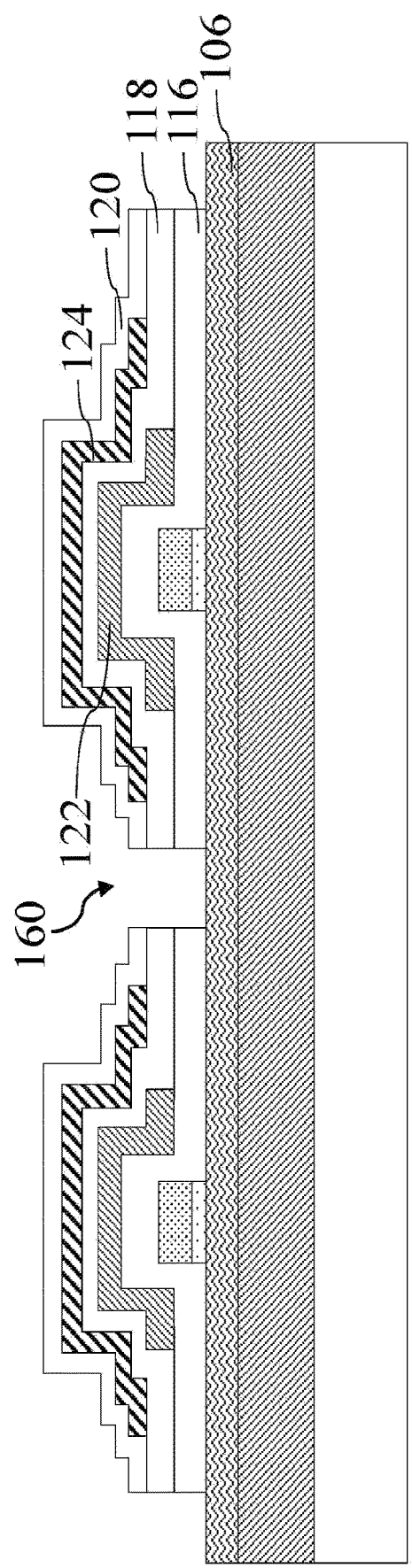

Referring to FIG. 3J, S/D regions 160 are formed by removing some portions of the passivation layers 116, 118, 120. At least one portion of the nitride-based semiconductor layer 106 is exposed from the S/D regions 160.

Referring to FIG. 3K, a blanket conductive layer 125 is formed above the resulted structure of FIG. 3J. The blanket conductive layer 125 is conformal with the resultant structure of FIG. 3J. The blanket conductive layer 125 is formed to cover the nitride-based semiconductor layer 106 and the passivation layers 116, 118, 120. The blanket conductive layer 125 is formed to fill the S/D regions 160, thereby contacting with the nitride-based semiconductor layer 106. The next stage is patterning the blanket conductive layer 125. According to the desired requirements, the blanket conductive layer 125 can be patterned to have different profiles.

Referring to FIG. 3L, which shows one of the patterning results for the blanket conductive layer 125, S/D electrodes 126 are formed by patterning the blanket conductive layer 125. Some portions of the blanket conductive layer 125 are removed, and rest of the blanket conductive layer 125 within the S/D regions 160 remains to serve as the S/D electrodes 126. In some embodiments, an entirety of the S/D electrodes 126 (i.e., the remaining blanket conductive layer 125) is lower than the passivation layer 120. In some embodiments, the blanket conductive layer 125 can be formed to be thicker, such that the S/D electrodes 126 (i.e., the remaining blanket conductive layer 125) is in a position higher than the passivation layer 120.

Referring to FIG. 3M, which shows another one of the patterning results for the blanket conductive layer 125, S/D electrodes 126 are formed in the same manner as in FIG. 3L. Another remaining portion 127 of the blanket conductive layer 125 is located on the passivation layer 120 and is separated from the S/D electrodes 126. The portion 127 can serve as at least one gate field plate above the field plates 122 and 124 and further laterally spans the field plates 122 and 124. That is, patterning the blanket conductive layer 125 not only can form the S/D electrodes 126 but also form the gate field plate. Therefore, the formation of the S/D electrodes 126 and the gate field plate can be integrated into one stage.

After the formation of the S/D electrodes 126, the follow-up processes can be performed for forming passivation layers, vias, and patterned conductive layers over the resultant structure of FIG. 3L or 3M, thereby obtaining the structure of FIGS. 1A-1C. The process for forming the passivation layer serving as a planarization layer includes a chemical mechanical polish (CMP) process. The process for forming the vias includes forming a conductive layer and removing the excess portions of the conductive layer. The process for forming the patterned conductive layers includes photolithography, exposure and development, etching, other suitable processes, or combinations thereof.

Figure 4:
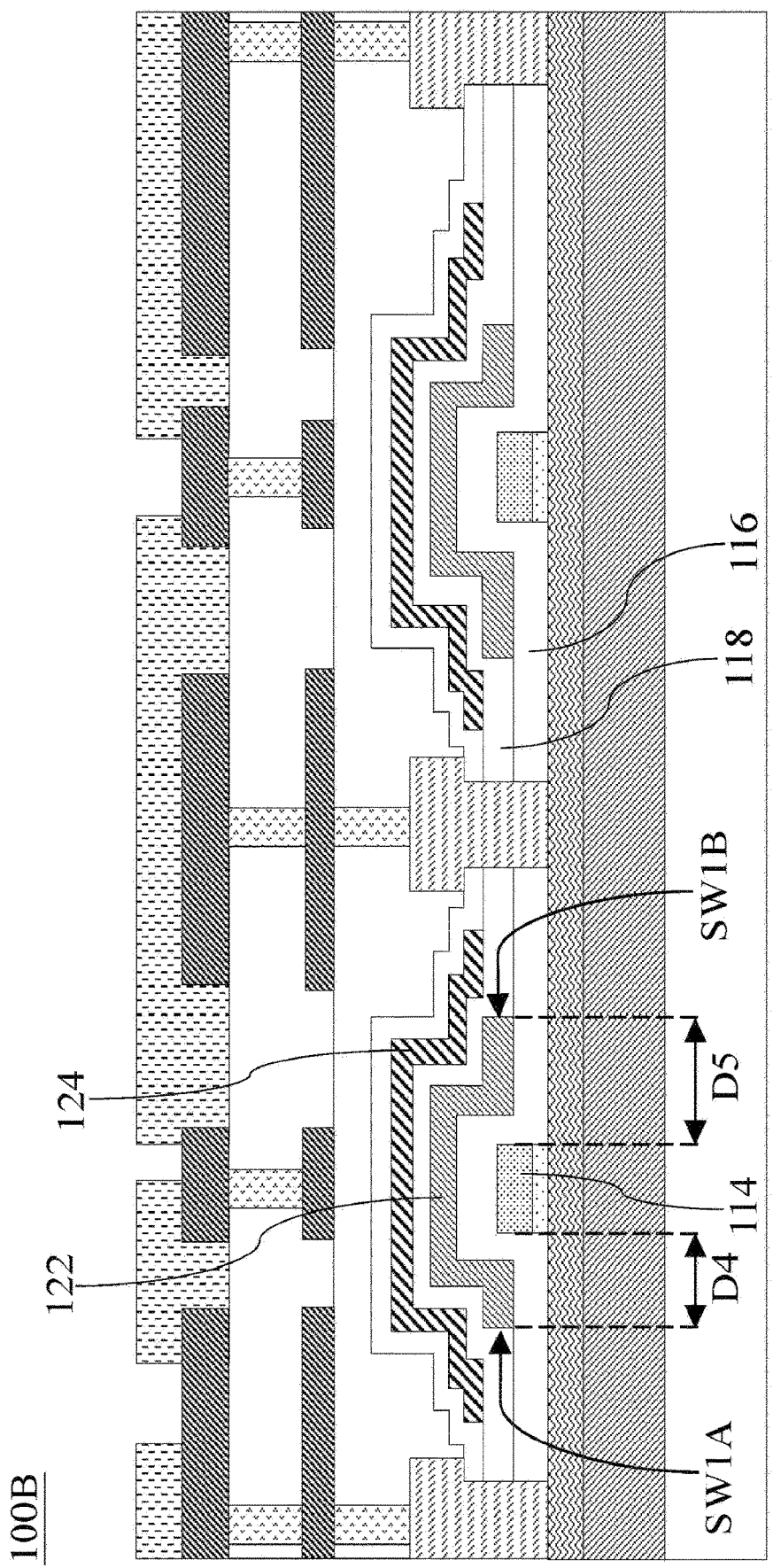
FIG. 4 is a cross-sectional view of a semiconductor device according to some embodiments of the present disclosure.

FIG. 4 is a cross-sectional view of a semiconductor device 100B according to some embodiments of the present disclosure. In the present embodiment, as shown in the exemplary illustration of FIG. 4, two opposite sidewalls SW1A and SW1B of the field plate 122 are asymmetrical about the gate electrode 114 of the gate structure. In order not to make the drawing too complex, the sidewalls SW1A and SW1B of the field plate 122 are depicted as being flat. Practically, the sidewalls SW1A and SW1B of the field plate 122 extend upward from the passivation layer 116 and are recessed inward to receive the passivation layer 118. Regarding the asymmetry, a distance D4 from the sidewall SW1A to the gate electrode 114 is different than a distance D5 from the sidewall SW1B to the gate electrode 114. The distance D4 is less than the distance D5. In the semiconductor device 100C, the field plates 122 and 124 can be patterned by wet and dry etching processes, respectively, as well, and thus the field plate design of the present disclosure is flexible, being available to satisfy different device requirements.

Figure 5:
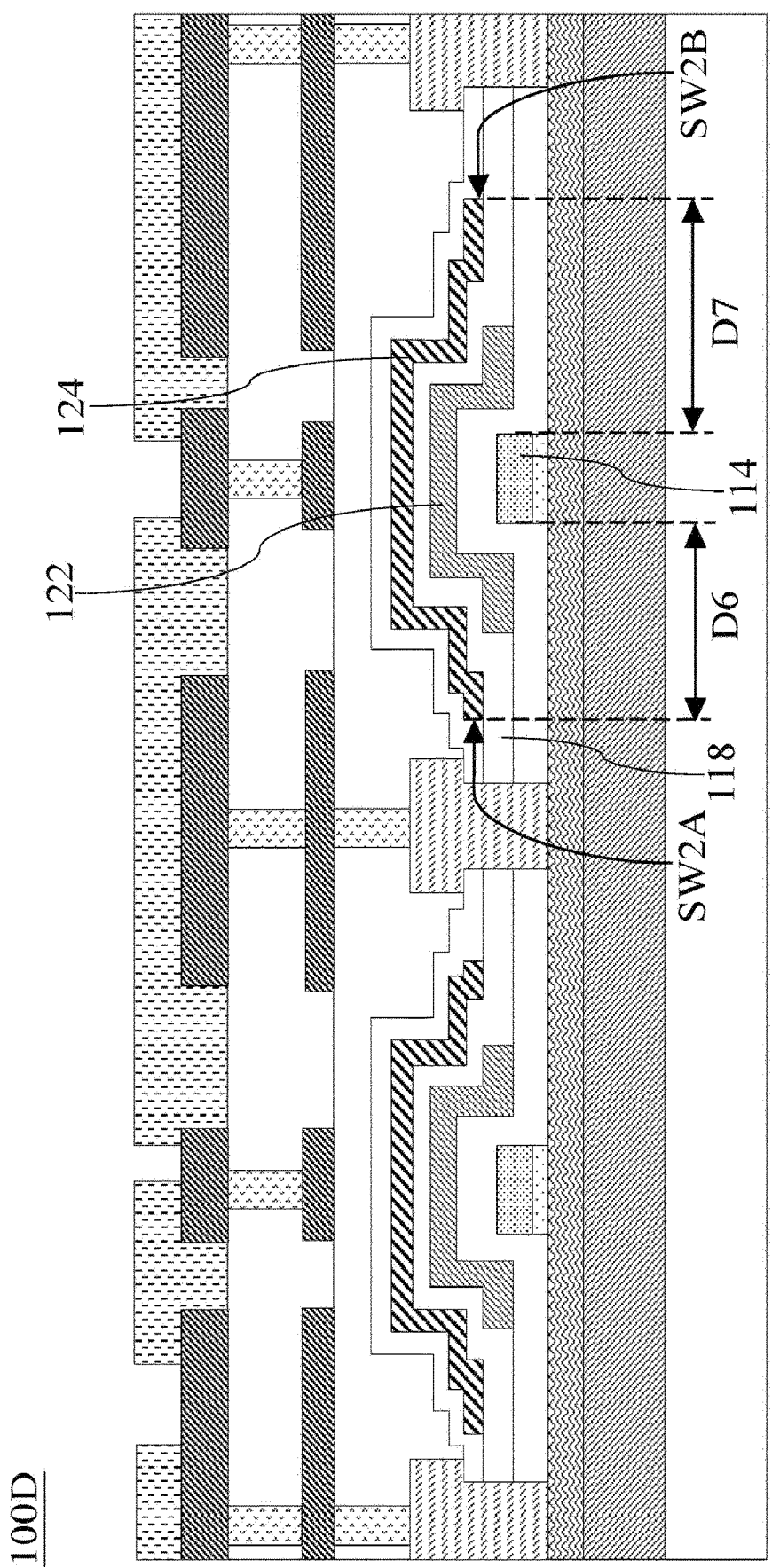
FIG. 5 is a cross-sectional view of a semiconductor device according to some embodiments of the present disclosure.

FIG. 5 is a cross-sectional view of a semiconductor device 100C according to some embodiments of the present disclosure. In the present embodiment, as shown in the exemplary illustration of FIG. 5, two opposite sidewalls SW2A and SW2B of the field plate 124 are asymmetrical about the gate electrode 114 of the gate structure. In order not to make the drawing too complex, the sidewalls SW2A and SW2B of the field plate 124 are depicted as being vertically flat. Practically, the sidewalls SW2A and SW2B of the field plate 124 extend upward from the passivation layer 120 and are oblique. Regarding the asymmetry, a distance D6 from the sidewall SW2A to the gate electrode 114 is different than a distance D7 from the sidewall SW2B to the gate electrode 114. The distance D6 is less than the distance D7. In the semiconductor device 100C, the field plates 122 and 124 can be patterned by wet and dry etching processes, respectively, as well, and thus the field plate design of the present disclosure is flexible, being available to satisfy different device requirements.

The foregoing description of the present invention has been provided for the purposes of illustration and description. It is not intended to be exhaustive or to limit the invention to the precise forms disclosed. Many modifications and variations will be apparent to the practitioner skilled in the art. Different embodiments can be combined. For example, although FIG. 4 only shows the field plate 122 asymmetrical about the gate electrode 114 and FIG. 5 only shows the field plate 124 asymmetrical about the gate electrode 114, in some embodiments, both the field plates 122 and 124 can be asymmetrical about the gate electrode 114. For example, although FIG. 5 only shows the sidewall SW1A of the field plate 122 is closer to the gate electrode 114 than the sidewall SW1B of the field plate 122, in some embodiments, the sidewall SW1A of the field plate 122 can be farther from the gate electrode 114 than the sidewall SW1B of the field plate 122.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 m of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A method for manufacturing a semiconductor device, comprising:
    forming a first nitride-based semiconductor layer over a substrate;
    forming a second nitride-based semiconductor layer on the first nitride-based semiconductor layer;
    forming a gate electrode over the second nitride-based semiconductor layer;
    forming a first passivation layer on the second nitride-based semiconductor layer to cover the gate electrode;
    forming a first blanket field plate on the first passivation layer;
    patterning the first blanket field plate to form a first field plate above the gate electrode using a wet etching process;
    forming a second passivation layer on the first passivation layer to cover the first field plate;
    forming a second blanket field plate on the second passivation layer; and
    patterning the second blanket field plate to form a second field plate above the first field plate using a dry etching process.

2. The method of claim 1, further comprising:
forming a third passivation layer to cover the second field plate.

3. The method of claim 1, wherein patterning the first blanket field plate is performed such that the first field plate laterally spans across the gate electrode.

4. The method of claim 1, wherein patterning the second blanket field plate is performed such that the second field plate laterally spans across the first field plate.

5. The method of claim 1, further comprising:
forming a pair of source/drain (S/D) electrodes over the second nitride-based semiconductor layer, such that the gate electrode, the first field plate, and the second field plate are located between the S/D electrodes.

* * * * *